United States Patent
Yang

(10) Patent No.: US 8,796,746 B2
(45) Date of Patent: *Aug. 5, 2014

(54) METHOD AND STRUCTURE OF MONOLITHICALLY INTEGRATED PRESSURE SENSOR USING IC FOUNDRY-COMPATIBLE PROCESSES

(75) Inventor: Xiao (Charles) Yang, Cupertino, CA (US)

(73) Assignee: mCube Inc., San Jose, CA (US)

(*) Notice: Subject to any disclaimer, the term of this patent is extended or adjusted under 35 U.S.C. 154(b) by 959 days.

This patent is subject to a terminal disclaimer.

(21) Appl. No.: 12/499,027

(22) Filed: Jul. 7, 2009

(65) Prior Publication Data

US 2010/0171153 A1   Jul. 8, 2010

Related U.S. Application Data

(60) Provisional application No. 61/079,112, filed on Jul. 28, 2008, provisional application No. 61/079,115, filed on Jul. 8, 2008, provisional application No. 61/079,116, filed on Jul. 8, 2008.

(51) Int. Cl.
*H01L 29/84* (2006.01)
*H01L 21/30* (2006.01)

(52) U.S. Cl.
USPC ............ 257/254; 257/E29.324; 257/E21.211

(58) Field of Classification Search
USPC .......................... 257/254, E21.211, E29.324
See application file for complete search history.

(56) References Cited

U.S. PATENT DOCUMENTS

| 6,393,913 | B1* | 5/2002 | Dyck et al. ................. 73/504.12 |
| 7,536,769 | B2* | 5/2009 | Pedersen ........................ 29/594 |
| 7,885,423 | B2 | 2/2011 | Weigold |
| 2009/0278217 | A1* | 11/2009 | Laming et al. ................ 257/419 |
| 2010/0164025 | A1* | 7/2010 | Yang ............................ 257/416 |

OTHER PUBLICATIONS

Non-Final Office Action for U.S. Appl. No. 12/490,292, mailed on Oct. 27 2011, 14 pages.
Final Office Action for U.S. Appl. No. 12/490,292, mailed on Mar. 6, 2012, 19 pages.

* cited by examiner

*Primary Examiner* — Matthew W Such
*Assistant Examiner* — Monica D Harrison
(74) *Attorney, Agent, or Firm* — Kilpatrick Townsend Stockton LLP

(57) ABSTRACT

A monolithically integrated MEMS pressure sensor and CMOS substrate using IC-Foundry compatible processes. The CMOS substrate is completed first using standard IC processes. A diaphragm is then added on top of the CMOS. In one embodiment, the diaphragm is made of deposited thin films with stress relief corrugated structure. In another embodiment, the diaphragm is made of a single crystal silicon material that is layer transferred to the CMOS substrate. In an embodiment, the integrated pressure sensor is encapsulated by a thick insulating layer at the wafer level. The monolithically integrated pressure sensor that adopts IC foundry-compatible processes yields the highest performance, smallest form factor, and lowest cost.

25 Claims, 8 Drawing Sheets

METHOD AND STRUCTURE OF MONOLITHICALLY INTEGRATED PRESSURE SENSOR USING IC FOUNDRY-COMPATIBLE PROCESSES

CROSS-REFERENCES TO RELATED APPLICATIONS

This application claims priority to U.S. Provisional Patent Application No. 61/079,110, filed Jul. 8, 2008, U.S. Provisional Patent Application No. 61/079,112, filed Jul. 8, 2008, U.S. Provisional Patent Application No. 61/079,113, filed Jul. 8, 2008, U.S. Provisional Patent Application No. 61/079,115, filed Jul. 8, 2008, U.S. Provisional Patent Application No. 61/079,116, filed Jul. 8, 2008, U.S. Provisional Patent Application No. 61/079,117, filed Jul. 8, 2008, U.S. Provisional Patent Application No. 61/084,223, filed Jul. 28, 2008, and U.S. Provisional Patent Application No. 61/084,226, filed Jul. 28, 2008, all of which are commonly owned and are incorporated in their entirety herein by reference for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to integrated micro-machined and integrated circuit devices. More particularly, the present invention provides a sensing device integral with integrated circuits, such as CMOS integrated circuits, which are foundry compatible. Merely by way of example, the present invention can be applied to a variety of applications, such as consumer, security, industrial, and medical.

Pressure sensors have been widely in industry. Conventional pressure sensors are used in consumer, industrial, and medical applications. Examples of consumer applications include gauges for tires, which are mounted on automobiles. Conventional bathroom type weight scales also use conventional pressure sensing devices. Industrial applications include pressure sensors in pipes for processing chemicals, oil, and semiconductor devices. Medical applications such as blood pressure monitors also rely upon conventional pressure sensing devices. Although highly successful and widely used, conventional pressure sensors have limitations in size, performance, and costs.

Specifically, conventional pressure sensors often use conventional micromachining techniques, common called "MEMS" techniques. Micromachined or MEMS pressure sensors are fabricated using bulk and surface micromachining techniques. Such bulk and surface machining techniques have limitations. That is, conventional bulk and surface machining techniques are often stand alone and are able to produce discrete MEMS based devices. Although highly successful, the MEMS based devices still have limitations. These and other limitations are described throughout the present specification and more particularly below.

Thus, it is desirable to have an improved MEMS device and more particularly pressure sensors.

BRIEF SUMMARY OF THE INVENTION

According to the present invention, techniques related generally to integrated micro-machined and integrated circuit devices are provided. More particularly, the present invention provides a sensing device integral with integrated circuits, such as CMOS integrated circuits, which are foundry compatible. Merely by way of example, the present invention can be applied to a variety of applications, such as consumer, security, industrial, and medical.

The present invention relates to integrating a MEMS pressure sensor on top of a CMOS substrate monolithically using IC-Foundry compatible processes. In some embodiments, the CMOS substrate is completed first using standard IC processes. A diaphragm is then added on top of the CMOS. In one embodiment, the diaphragm is made of deposited thin films with stress relief corrugated structure. In another embodiment, the diaphragm is made of a single crystal silicon material that is layer transferred to the CMOS substrate. In a specific embodiment, the integrated pressure sensor is encapsulated by a thick insulating layer at the wafer level. The monolithically integrated pressure sensor that adopts IC foundry-compatible processes yields the highest performance, smallest form factor, and lowest cost. The monolithically integrated pressure sensor can be used in a variety of applications, for example, for integrating a microphone device with signal processing and logic circuits.

In an embodiment, the present invention provides a pressure sensing device that includes a substrate having a surface region, a CMOS integrated circuit device layer overlying the surface region of the substrate, a diaphragm device having one or more surface regions overlying the CMOS integrated circuit device layer, and at least one or more spring devices spatially disposed within a vicinity of the one or more surface regions of the diaphragm device. Each of the folded spring devices being operably coupled to the one or more surface regions of the diaphragm device.

Other embodiments of pressure sensing devices and methods are described in more detail below.

Various additional properties, features, and advantages of the present invention can be more fully appreciated with reference to the detailed description and accompanying drawings that follow.

DETAILED DESCRIPTION OF THE INVENTION

According to the present invention, techniques related generally to integrated micromachined and integrated circuit devices are provided. More particularly, the present invention provides a sensing device integral with integrated circuits, such as CMOS integrated circuits, which are foundry compatible. Merely by way of example, the present invention can be applied to a variety of applications, such as consumer, security, industrial, and medical.

Figure 1:
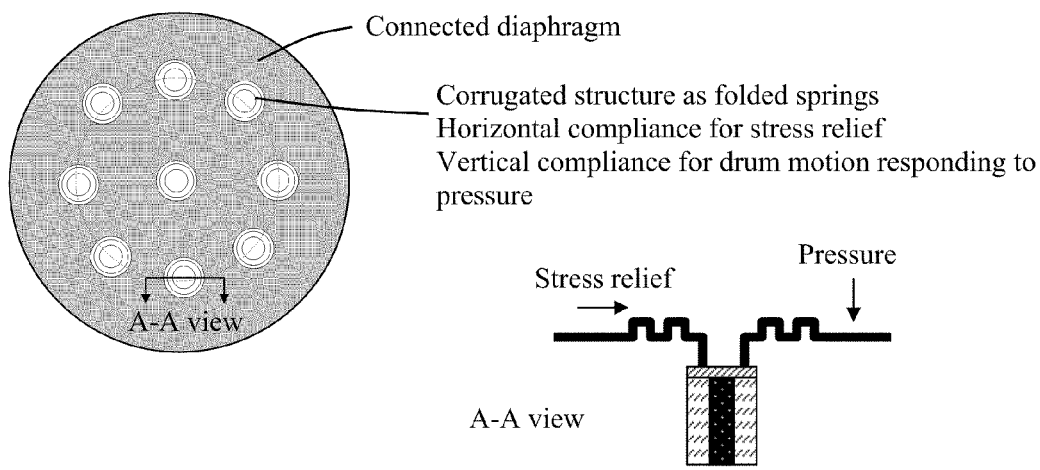
FIG. 1 is a simplified diagram of components of a micromachined pressure sensor according to one embodiment of the present invention.
Figure 1:
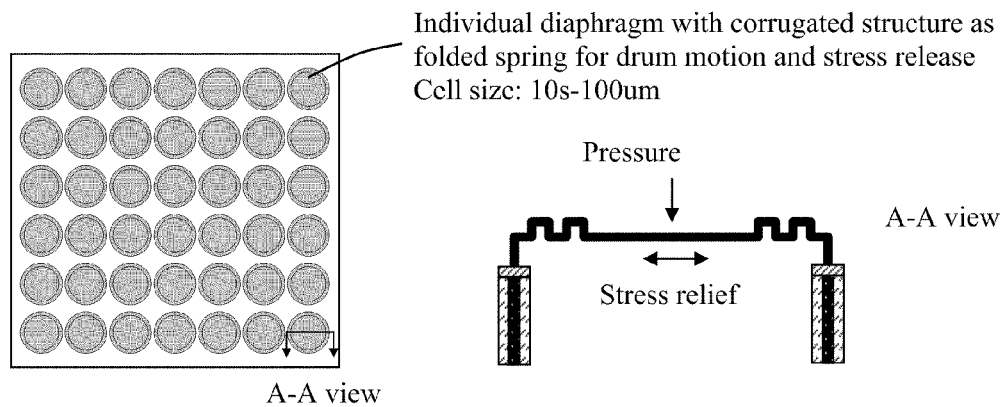

FIG. 1 is a simplified diagram of components of a micromachined pressure sensor according to one embodiment of the present invention. As depicted, the diaphragm is either a continuous layer or an array of smaller diaphragm cells. To obtain high sensitivity of the microphone, a large and thin diaphragm is essential. It is, however, difficult to achieve due to intrinsic stress of the diaphragm film. As shown in the cross section view, a corrugated structure is adopted as folded springs. The folded spring has a horizontal compliance that is used for stress relief of the diaphragm film. The folder spring also has a vertical compliance that is used for drum motion responding to a sound pressure. In the continuous diaphragm configuration, the corrugated structures are evenly distributed with local supporting posts. In the array configuration, the diaphragm in each cell has corrugated structures at the edge and is anchored at the perimeter.

Figure 2:
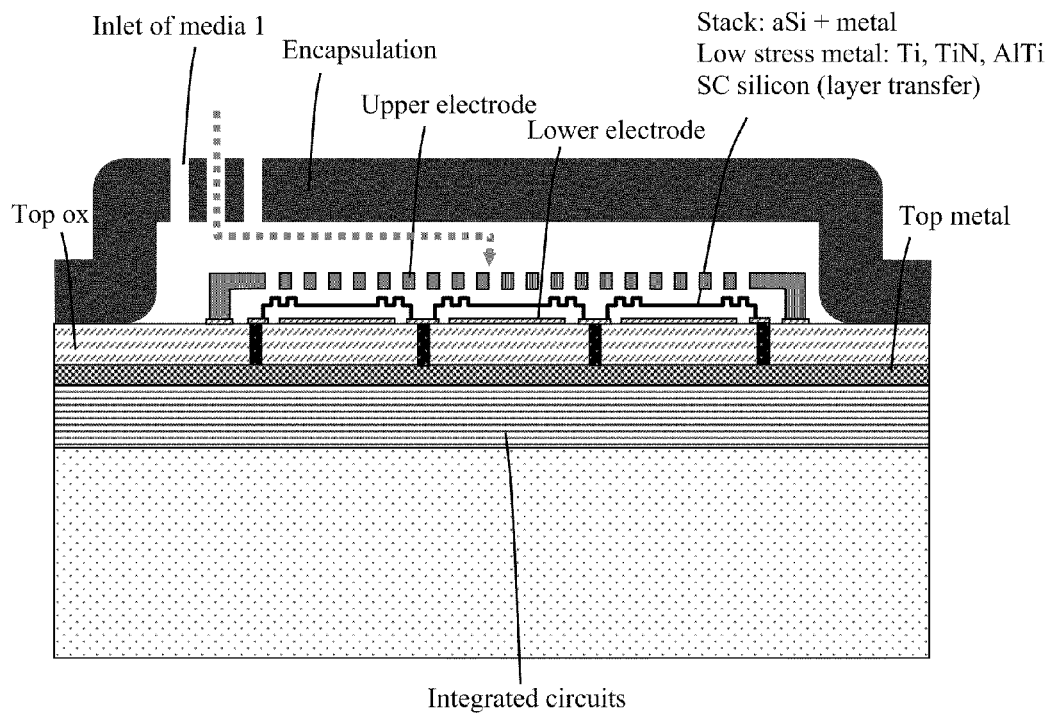
FIG. 2 is a simplified cross section diagram of components of a micromachined pressure sensor according to one embodiment of the present invention.

FIG. 2 is a simplified cross section diagram of components of a micromachined pressure sensor according to one embodiment of the present invention. As depicted, a diaphragm with corrugated springs is overlying a fully completed CMOS substrate. In one embodiment, the diaphragm is consisted with a stack of thin films such as amorphous Silicon and metal layers. In another embodiment, the diaphragm is a low stress metal thin film such as Ti, TiN, or AlTi alloy. In another embodiment, the diaphragm is a thin layer of single crystal silicon. Lower electrodes are formed at the top of the top oxide of the CMOS substrate to form a capacitor with the diaphragm. Optional upper electrodes can be formed on top of the diaphragm to form a differential output for increased sensitivity. A thick layer of insulating material with fluid inlet holes is formed on top of the diaphragm to encapsulate the pressure sensor.

Figure 3:
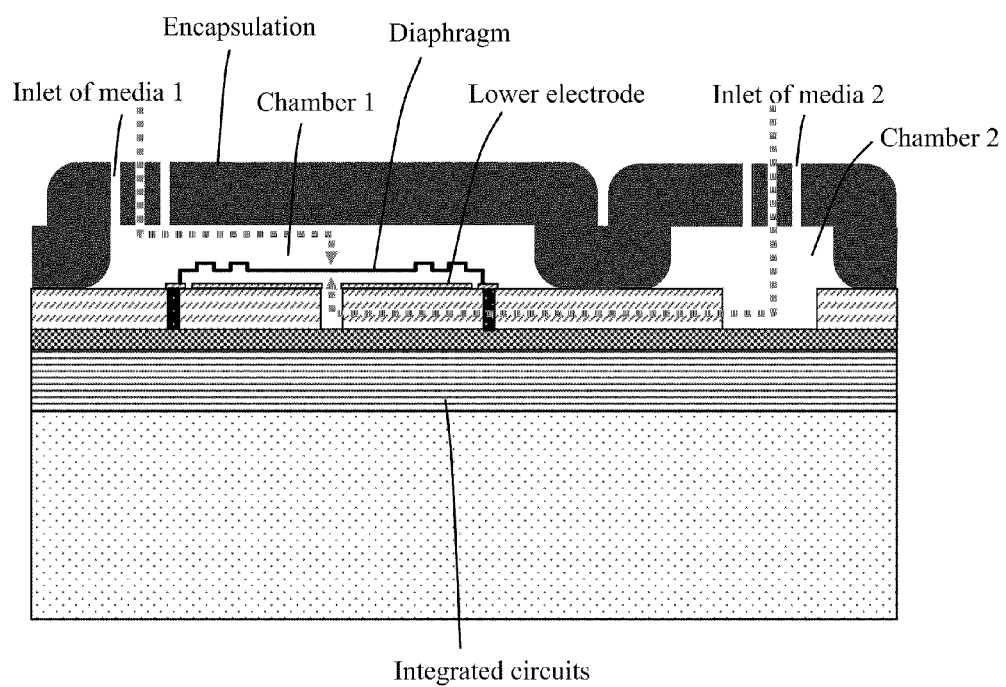
FIG. 3 is a simplified cross section diagram of components of a micromachined pressure sensor according to one embodiment of the present invention.

FIG. 3 is a simplified cross section diagram of components of a micromachined pressure sensor according to one embodiment of the present invention. As depicted, there are two separated chambers for two independent media inlets. The top oxide has embedded fluid channels that allow media 2 to flow from chamber 2 to the backside of the diaphragm in chamber 1.

Figure 4:
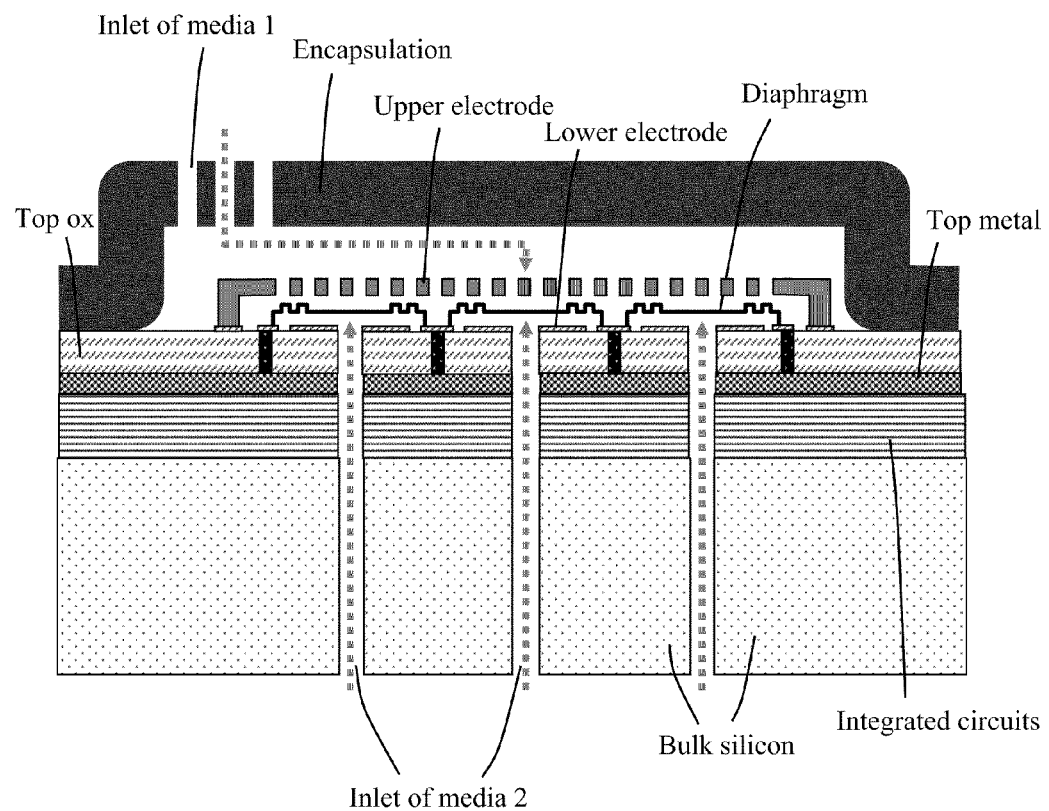
FIG. 4 is a simplified cross section diagram of components of a micromachined pressure sensor according to one embodiment of the present invention.

FIG. 4 is a simplified cross section diagram of components of a micromachined pressure sensor according to one embodiment of the present invention. As depicted, fluid channels formed within the silicon substrate to allow media 2 to flow from the bottom of the substrate to the backside of the diaphragm.

Figure 5:
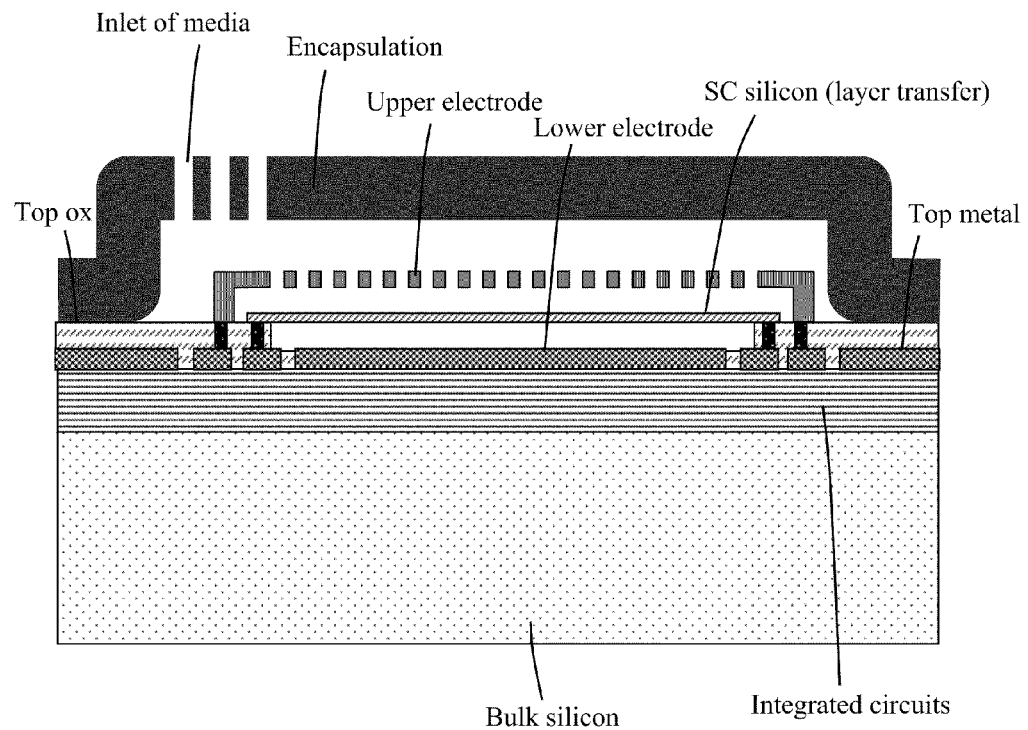
FIG. 5 is a simplified cross section diagram of components of a micromachined pressure sensor according to one embodiment of the present invention.

FIG. 5 is a simplified cross section diagram of components of a micromachined pressure sensor according to one embodiment of the present invention. As depicted, the diaphragm is made of a single crystal silicon material. In one embodiment, a SOI wafer is bond to the CMOS substrate. After removing the bulk silicon and BOX, the SOI layer is then released and becomes the diaphragm.

Figure 6:
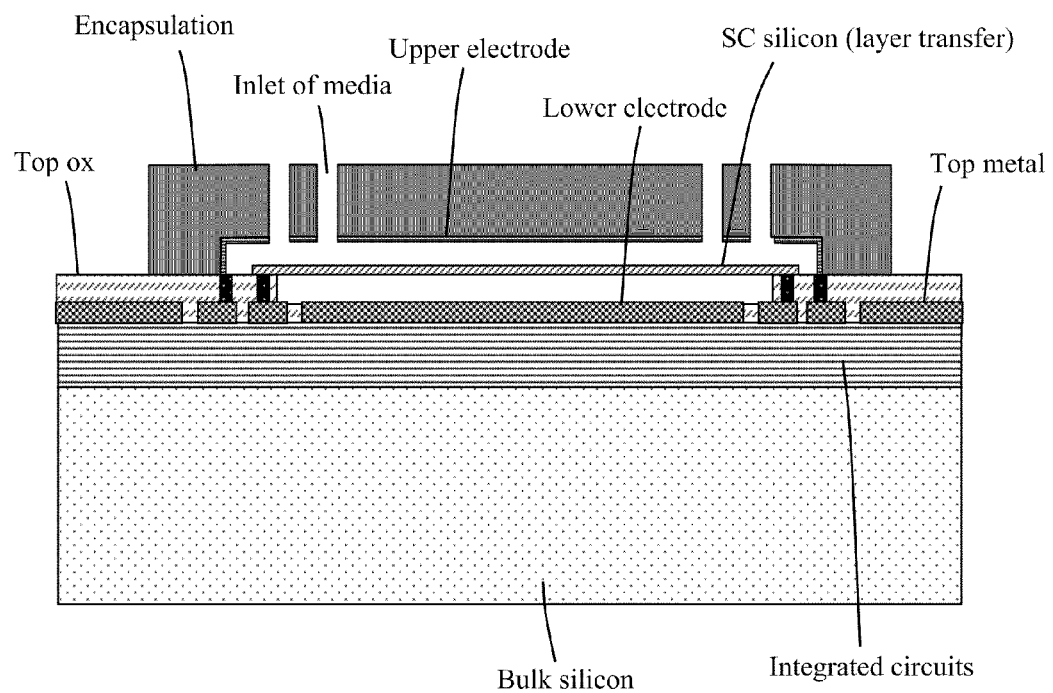
FIG. 6 is a simplified cross section diagram of components of a micromachined pressure sensor according to one embodiment of the present invention.

FIG. 6 is a simplified cross section diagram of components of a micromachined pressure sensor according to one embodiment of the present invention. As depicted, the encapsulation consisted of a thick insulation layer and a conductive layer at the bottom. The bottom conductive layer becomes the upper electrode.

Figure 7:
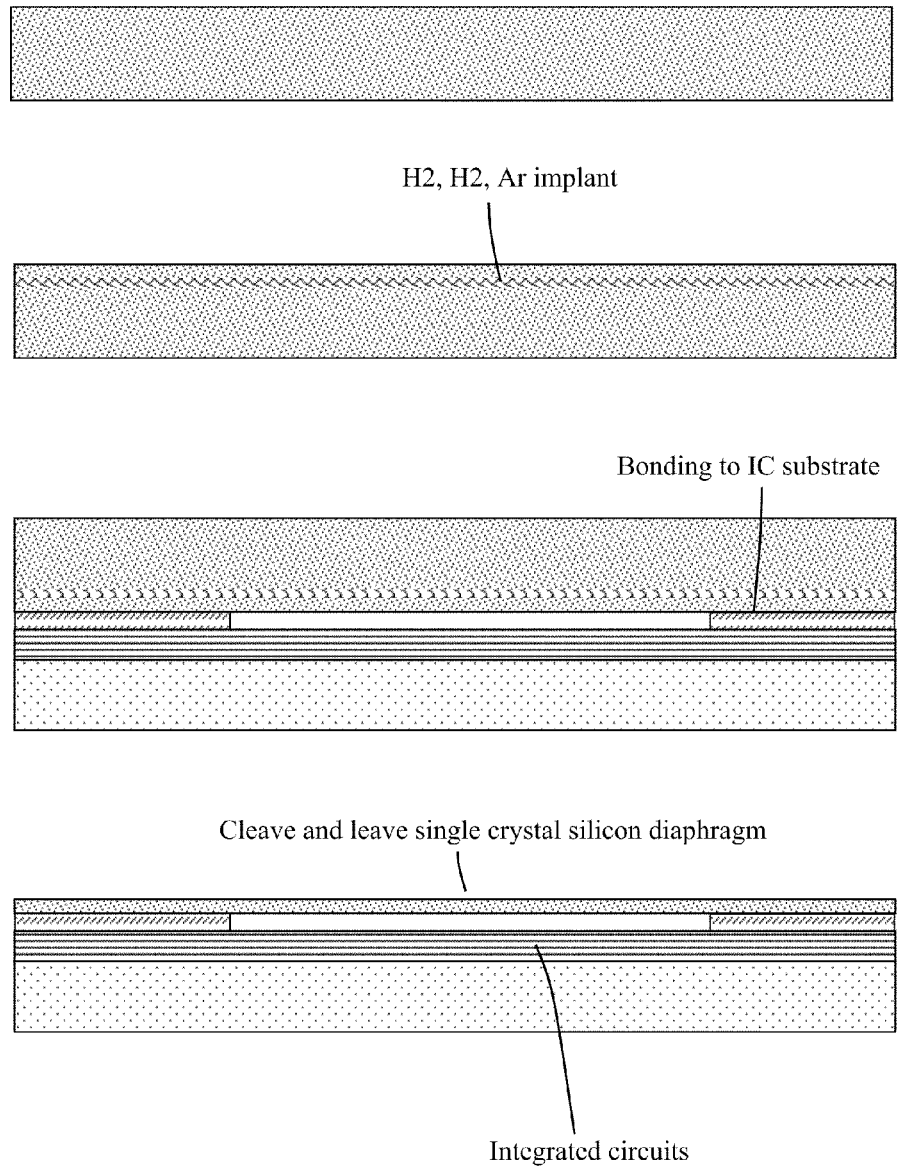
FIG. 7 is a simplified cross section diagram of fabrication process flow of a micromachined pressure sensor according to one embodiment of the present invention.

FIG. 7 is a simplified cross section diagram of fabrication process flow of a micromachined pressure sensor according to one embodiment of the present invention. As depicted, H2, He, or Argon is implanted in a desired depth in a silicon substrate. The silicon substrate is then bonded to the CMOS substrate using low temperature bonding methods such as covalent, eutectic, or other low temperature methods. Finally, a cleaving step separates the thin silicon layer from the bulk substrate. The thin silicon layer becomes the diaphragm.

Figure 8:
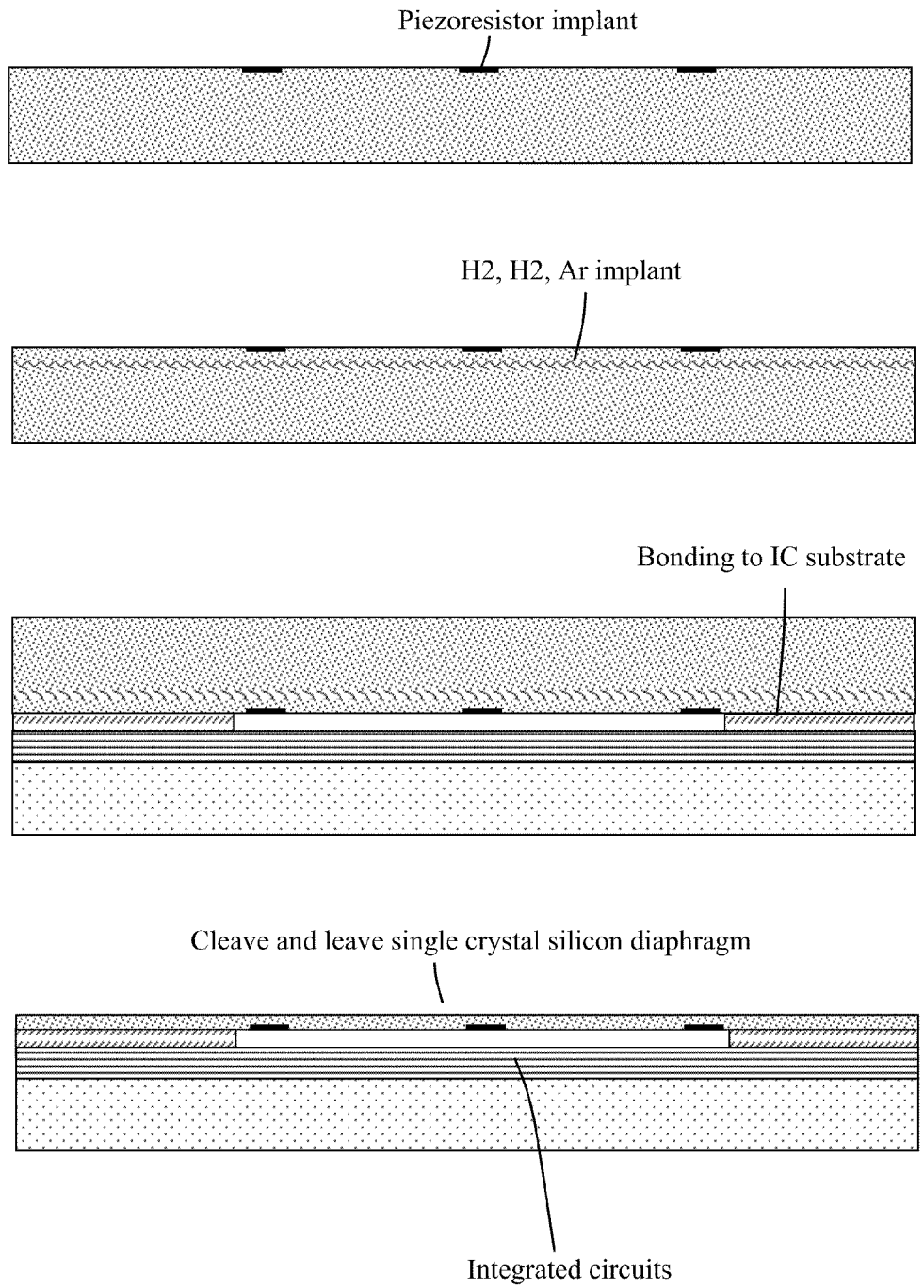
FIG. 8 is a simplified cross section diagram of fabrication process flow of a micromachined pressure sensor according to one embodiment of the present invention.

FIG. 8 is a simplified cross section diagram of fabrication process flow of a micromachined pressure sensor according to one embodiment of the present invention. As depicted, piezoresistors are implanted in a silicon substrate. H2, He, or Argon is then implanted in a desired depth in the silicon substrate. The silicon substrate is then bonded to the CMOS substrate using low temperature bonding methods such as covalent, eutectic, or other low temperature methods. Finally, a cleaving step separates the thin silicon layer from the bulk substrate. The thin silicon layer becomes the diaphragm and the embedded piezoresistors sense strains induced by the deformation of the diaphragm due to an external pressure.

In an embodiment, the present invention provides a pressure sensing device that includes a substrate having a surface region, a CMOS integrated circuit device layer overlying the surface region of the substrate, a diaphragm device having one or more surface regions overlying the CMOS integrated circuit device layer, and at least one or more spring devices spatially disposed within a vicinity of the one or more surface regions of the diaphragm device. Each of the folded spring devices being operably coupled to the one or more surface regions of the diaphragm device.

In an embodiment of the above pressure sending device, the one or more spring devices includes one or more folded spring devices. In another embodiment, the one or more spring devices being integrally formed within the one or more surface regions of the diaphragm device. In another embodiment, the one or more surface regions has a uniformity of 5 percent and less variation. In yet another embodiment, the diaphragm device is characterized by a thickness of about one micron and less. In another embodiment, the diaphragm device is made of a semiconductor material, a metal material, or a dielectric material or any combination of these.

In another embodiment, the one or more surface regions comprises an array being defined by N and M, where N and M are integers greater than 2. In another embodiment, the one or more surface regions includes at least one surface region disposed within a center region of the diaphragm and a plurality of surface regions disposed radially around the center region of the diaphragm. In a specific embodiment, the diaphragm device directly overlies the CMOS integrated surface region. In a specific embodiment, the diaphragm device can include a plurality of spring devices spatially disposed within a vicinity of the one or more surface regions of the diaphragm device. Each of the plurality of spring devices can be operably coupled to at least one of the one or more surface regions of the diaphragm device. The plurality of spring devices can be configured radially around a center portion of the diaphragm device. Those of ordinary skill in the art will recognize other variations modifications, and alternatives.

In another embodiment, the above pressure sensing device also includes one or more lower electrodes operably coupled to one or more of the surface regions. In another embodiment, the pressure sensing device also includes one or more upper electrodes operably coupled to one or more of the surface regions to form one or more variable capacitor structures. In yet another embodiment, each of the one or more lower electrodes comprises one or more metal regions coupled to one or more of CMOS integrated circuits in the CMOS integrated circuit device layer. In another embodiment, each of the one or more lower electrodes has one or more metal regions overlying an upper dielectric layer provided on the CMOS integrated circuit device layer. In still another embodiment, the sensor also has one or more vent regions provided adjacent to one or more of the lower electrodes, the one or more of the vent regions extending to a cavity region within a portion substrate. In another embodiment, the pressure sensor also includes a housing member provided overlying the diaphragm device to form a cavity region between the housing member and the diaphragm device. The housing member has one or more fluid openings to allow fluid to move between the cavity and a region outside of the housing member.

According to another embodiment of the invention, a pressure sensing device includes a substrate having a surface region, a CMOS integrated circuit device layer overlying the surface region of the substrate, and a diaphragm device having one or more surface regions overlying the CMOS integrated circuit device layer. The pressure sensing device also has at least one or more spring devices spatially disposed within a vicinity of the one or more surface regions of the diaphragm device. Each of the folded spring devices being operably coupled to the one or more surface regions of the diaphragm device. The pressure sensing device also has two or more electrode devices operably coupled to each of the one or more surface regions and at least one fluid channel formed between the two or more electrode devices.

In an embodiment of the above pressure sending device, the one or more spring devices comprises one or more folded spring devices. In another embodiment, the one or more spring devices being integrally formed within the one or more surface regions of the diaphragm device. In another embodiment, the one or more surface regions has a uniformity of 5 percent and less variation. In another embodiment, the diaphragm device is characterized by a thickness of about one micron and less. In another embodiment, the diaphragm device is made of a semiconductor material, a metal material, or a dielectric material or any combination of these. In another embodiment, the one or more surface regions comprises an array being defined by N and M, where N and M are integers greater than 2.

In another embodiment, the one or more surface regions comprises at least one surface region disposed within a center region of the diaphragm and a plurality of surface regions disposed radially around the center region of the diaphragm. In another embodiment, the pressure sending device also includes one or more fluid vent regions provided within a vicinity of the two or more electrode devices. In another embodiment, the pressure sending device further includes a housing member provided overlying the diaphragm device to form a cavity region between the housing member and the diaphragm device. The housing member comprising one or more fluid openings to allow fluid to move between the fluid cavity and a region outside of the housing member. In another embodiment, the pressure sending device also includes a housing member provided overlying the diaphragm device to form a cavity region between the housing member and the diaphragm device. The housing member comprising one or more fluid openings to allow fluid to move between the fluid cavity and a region outside of the housing member. The pressure sensing device also has one or more fluid vent regions provided within a vicinity of the two or more electrode devices, the one or more vent regions being in fluid communication with the fluid cavity.

According to yet another embodiment of the invention, a pressure sensing device includes a substrate having a surface region, a CMOS integrated circuit device layer overlying the surface region of the substrate, a diaphragm device having at least a first surface region facing the CMOS integrated circuit device layer and a second surface region opposite the first surface region, and at least one or more spring devices spatially disposed within a vicinity of the first surface region of the diaphragm device, each of the folded spring devices being operably coupled to the first surface region of the diaphragm device. The pressure sensing device also has two or more electrode devices operably coupled to the first surface region and at least one fluid channel formed between the two or more electrode devices. At least one of the fluid channels is in communication with the first surface region of the diaphragm device. The pressure sensing device also has a housing member provided overlying the diaphragm device to form a cavity region between the housing member and the diaphragm device. The housing member includes one or more first fluid openings to allow fluid to move between the cavity and a first region outside of the housing member. The one or more fluid openings are in communication with the second surface region of the diaphragm.

According to another embodiment of the invention, a pressure sensing device has a substrate having a surface region and a bulk region, a CMOS integrated circuit device layer overlying the surface region of the substrate, and a diaphragm device having one or more surface regions overlying the CMOS integrated circuit device layer. The pressure sensing device also has at least one or more spring devices spatially disposed within a vicinity of the one or more surface regions of the diaphragm device, each of the folded spring devices being operably coupled to the one or more surface regions of the diaphragm device, and two or more electrode devices operably coupled to each of the one or more surface regions. The pressure sensing device also has at least one fluid channel formed between the two or more electrode devices, and a housing member provided overlying the diaphragm device to form a first cavity region between a first portion the housing member and the diaphragm device and provided to form a second cavity region between a second portion of the housing member and a portion of the CMOS integrated circuit device layer. The housing member has one or more fluid openings to allow fluid to move between the first cavity and a region outside of the housing member. Moreover, the pressure sensing device also has an isolation region between the first cavity and the second cavity, and at least one fluid communication channel coupling the at least one fluid channel and the second cavity. In an embodiment, the housing member has one or more upper electrode members, each of which is operably coupled to each of the one or more surface regions.

In another embodiment, a pressure sensing device has a substrate having a surface region and a bulk region, a CMOS integrated circuit device layer overlying the surface region of the substrate, and a diaphragm device having a first surface region facing and overlying the CMOS integrated circuit device layer and a second surface region opposite the first surface region. At least one or more spring devices are spatially disposed within a vicinity of the first surface region of the diaphragm device. Each of the folded spring devices being operably coupled to the first surface region of the diaphragm device. Two or more electrode devices are operably coupled to the first surface region. A first cavity region is provided between the first surface region and the CMOS integrated circuit device layer, the first cavity region being substantially sealed and maintains a predetermined environment. The pressure sensing device also has a housing member provided overlying the second surface region of the diaphragm device to form a second cavity region between the housing member and the diaphragm device, the housing member comprising one or more fluid openings to allow fluid to move between the second cavity and a region outside of the housing member.

In another embodiment, a pressure sensing device includes a substrate having a surface region and a bulk region, a CMOS integrated circuit device layer overlying the surface region of the substrate, and a diaphragm device having one or more surface regions overlying the CMOS integrated circuit device layer. The diaphragm device being formed from a portion of a single crystal silicon material. The pressure sensing device also has two or more electrode devices operably coupled to each of the one or more surface regions.

In an embodiment, the above pressure sensing device also has a housing overlying the diaphragm device and forming a cavity region between the housing and the diaphragm device. In an embodiment, the above pressure sensing device also has a housing overlying the diaphragm device and forming a cavity region between the housing and the diaphragm device. Additionally, one or more portions of the housing form one or more sensing electrode devices.

In another embodiment, the above pressure sensing device also has f a housing overlying the diaphragm device and forming a cavity region between the housing and the diaphragm device. The housing includes an outer region and an inner region. One or more inner portions of the inner region of the housing form one or more sensing electrode devices. In an embodiment, the single crystal silicon material is provided from a silicon on insulator substrate (SOI). In an embodiment, the single crystal silicon material is provided from a cleaved portion of single crystal silicon material.

According to an alternative embodiment, the invention provides a method of forming an integrated MEMS sensor and circuit device. The method includes providing a first semiconductor substrate having, a first surface region, one or more piezoresistor regions, and a cleave region provided between the first surface region and a bulk portion of the first semiconductor substrate. The method also includes joining the first surface region to a second surface region of a second semiconductor substrate. The second semiconductor substrate has a CMOS integrated circuit layer, a dielectric layer overlying the CMOS integrated circuit layer, and a cavity region provided within the dielectric layer. The method also includes releasing the bulk portion of the first semiconductor substrate while maintaining the first surface region attached to the second surface region.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A pressure sensing device comprising:
   a substrate having a surface region;
   a CMOS integrated circuit device layer overlying the surface region of the substrate;
   a diaphragm device having one or more surface regions directly overlying the CMOS integrated circuit device layer; and
   at least one or more spring devices spatially disposed within a vicinity of the one or more surface regions of the diaphragm device, each of the spring devices being operably coupled to the one or more surface regions of the diaphragm device.

2. The device of claim 1 wherein the one or more spring devices comprise one or more folded spring devices.

3. The device of claim 1 wherein the one or more spring devices are integrally formed within the one or more surface regions of the diaphragm device.

4. The device of claim 1 wherein the one or more surface regions has a uniformity of 5 percent and less variation.

5. The device of claim 1 wherein the diaphragm device is characterized by a thickness of about one micron and less.

6. The device of claim 1 wherein the diaphragm device is made of a semiconductor material, a metal material, or a dielectric material or any combination of these.

7. The device of claim 1 wherein the one or more surface regions comprises an array being defined by N and M, where N and M are integers greater than 2.

8. The device of claim 1 wherein the one or more surface regions comprises at least one surface region disposed within a center region of the diaphragm and a plurality of surface regions disposed radially around the center region of the diaphragm.

9. The device of claim 1 further comprising one or more lower electrodes operably coupled to one or more of the surface regions.

10. The device of claim 9 further comprising one or more upper electrodes operably coupled to one or more of the surface regions to form one or more variable capacitor structures.

11. The device of claim 9 wherein each of the one or more lower electrodes comprises one or more metal regions coupled to one or more of CMOS integrated circuits in the CMOS integrated circuit device layer.

12. The device of claim 9 wherein each of the one or more lower electrodes comprises one or more metal regions overlying an upper dielectric layer provided on the CMOS integrated circuit device layer.

13. The device of claim 9 further comprising one or more vent regions provided adjacent to one or more of the lower electrodes, the one or more of the vent regions extending to a cavity region within a portion of the substrate.

14. The device of claim 1 further comprising a housing member provided overlying the diaphragm device to form a cavity region between the housing member and the diaphragm device, the housing member comprising one or more fluid openings to allow fluid to move between the cavity and a region outside of the housing member.

15. A pressure sensing device comprising:
    a substrate having a surface region;
    a CMOS integrated circuit device layer overlying the surface region of the substrate;
    a diaphragm device having at least a first diaphragm surface region facing the CMOS integrated device layer and a second diaphragm surface region opposite the first surface region;
    at least one or more spring devices spatially disposed within a vicinity of the first diaphragm surface region of the diaphragm device, each of the folded spring devices being operably coupled to the first diaphragm surface region of the diaphragm device;
    two or more electrode devices operably coupled to the first diaphragm surface region;
    at least one fluid channel formed between the two or more electrode devices, at least one of the fluid channels being in communication with the first diaphragm surface region of the diaphragm device; and a housing member provided overlying the diaphragm device to form a cavity region between the housing member and the diaphragm device, the housing member comprising one or more first fluid openings to allow fluid to move between the cavity and a first region outside of the housing member, the one or more fluid openings being in communication with the second diaphragm surface region of the diaphragm.

16. A pressure sensing device comprising:
a substrate having a surface region and a bulk region;
a CMOS integrated circuit device layer overlying the surface region of the substrate;
a diaphragm device having a first surface region facing and overlying the CMOS integrated circuit device layer and a second surface region opposite the first surface region;
at least one or more folded spring devices spatially disposed within a vicinity of the first substrate region of the diaphragm device, each of the folded spring devices being operably coupled to the first surface region of the diaphragm device;
two or more electrode devices operably coupled to the first surface region;
a first cavity region provided between the first surface region and the CMOS integrated circuit device layer, the first cavity region being substantially sealed and maintaining a predetermined environment; and
a housing member provided overlying the second surface region of the diaphragm device to form a second cavity region between the housing member and the diaphragm device, the housing member comprising one or more fluid openings to allow fluid to move between the second cavity and a region outside of the housing member.

17. A pressure sensing device comprising:
a substrate having a surface region;
a CMOS integrated circuit device layer overlying the surface region of the substrate, the CMOS integrated circuit device layer having an embedded fluid channel; and
a diaphragm device having one or more-surface regions overlying the CMOS integrated circuit device layer, the diaphragm device being formed from a portion of a single crystal silicon material; and
a first cavity region provided between the diaphragm device and the CMOS integrated circuit device layer, the embedded fluid channel being in communication with the first cavity region.

18. The device of claim 17 further comprising a housing overlying the diaphragm device and forming a second cavity region between the housing and the diaphragm device.

19. The device of claim 17 further comprising a housing overlying the diaphragm device and forming a second cavity region between the housing and the diaphragm device; and wherein one or more portions of the housing form one or more sensing electrode devices, and wherein the housing forms a first chamber and a second chamber, the first chamber encapsulating the diaphragm device and the second cavity region, the second chamber being in communication with the embedded fluid channel.

20. The device of claim 17 further comprising a housing overlying the diaphragm device and forming a second cavity region between the housing and the diaphragm device, the housing comprising an outer region and an inner region; and wherein one or more inner portions of the inner region of the housing form one or more sensing electrode devices, and wherein the housing forms a first chamber and a second chamber, the housing member having a first fluid inlet and a second fluid inlet, the first fluid inlet allowing fluid to move between the first chamber and a first region outside of the housing member, the first chamber encapsulating the diaphragm device and the second cavity region, the second chamber being in communication with the embedded fluid channel, the second fluid inlet allowing fluid to move between the second chamber and a second region outside of the housing member.

21. The device of claim 17 wherein the single crystal silicon material is provided from a silicon on insulator substrate (Sal).

22. The device of claim 17 wherein the single crystal silicon material is provided from a cleaved portion of single crystal silicon material.

23. A pressure sensing device comprising:
a substrate having a surface region;
a CMOS integrated circuit device layer overlying the surface region of the substrate, the CMOS integrated circuit device layer having a CMOS surface region;
an oxide layer overlying the CMOS surface region, the oxide layer having an oxide surface region, the oxide layer having an embedded fluid channel;
a diaphragm device overlying the oxide surface region, the diaphragm device having a first diaphragm surface region facing the CMOS integrated surface region and a second diaphragm surface region opposite the first diaphragm surface;
at least one or more folded spring devices spatially disposed within a vicinity of the one or more surface regions of the diaphragm device, each of the folded spring devices being operably coupled to the one or more surface regions of the diaphragm device and one or more portions of the surface region of the substrate, each of the folded spring devices characterized as a corrugated structure coupled to the substrate; and
a housing member provided overlying the diaphragm device and the CMOS integrated device layer to form a first chamber encapsulating the diaphragm device and a second chamber within a vicinity of the first chamber, the housing member having a first fluid inlet and a second fluid inlet, the first fluid inlet allowing fluid to move between the first chamber and a first region outside of the housing member, the first fluid inlet being in communication with the second diaphragm surface region, the second fluid inlet allowing fluid to move between the second chamber and a second region outside of the housing member, the second fluid inlet being in communication with the first diaphragm surface region via the embedded fluid channel of the oxide layer.

24. The device of claim 23 wherein each of the one or more folded spring devices comprises a horizontal compliance and a vertical compliance.

25. A pressure sensing device comprising:
a substrate having a surface region and a bulk region;
a CMOS integrated circuit device layer overlying the surface region of the substrate;
a diaphragm device having one or more surface regions overlying the CMOS integrated circuit device layer, the diaphragm device being formed from a portion of a single crystal silicon material, the diaphragm device having a plurality of spring devices spatially disposed within a vicinity of the one or more surface regions of the diaphragm device, each of the plurality of spring devices being operably coupled to at least one of the one or more surface regions of the diaphragm device, the plurality of spring devices being configured radially around a center portion of the diaphragm device; and one or more lower electrodes operably coupled to one or more of the surface regions; and one or more upper electrodes operably coupled to the one or more of the surface regions to form one or more variable capacitor structures.

* * * * *